(12) United States Patent
Vaufrey et al.

(10) Patent No.: US 8,395,313 B2
(45) Date of Patent: Mar. 12, 2013

(54) LIGHT-EMITTING ORGANIC DIODE COMPRISING NOT MORE THAN TWO LAYERS OF DIFFERENT ORGANIC MATERIALS

(75) Inventors: David Vaufrey, Grenoble (FR); Jean-Claude Martinez, Chartres de Bretagne (FR); Salvatore Cina, Rennes (FR)

(73) Assignee: Thomson Licensing, Issy les Moulineaux (FR)

( * ) Notice: Subject to any disclaimer, the term of this patent is extended or adjusted under 35 U.S.C. 154(b) by 885 days.

(21) Appl. No.: 11/921,706

(22) PCT Filed: Jun. 9, 2006

(86) PCT No.: PCT/EP2006/063069
§ 371 (c)(1),
(2), (4) Date: Dec. 6, 2007

(87) PCT Pub. No.: WO2006/131565
PCT Pub. Date: Dec. 14, 2006

(65) Prior Publication Data
US 2009/0096354 A1    Apr. 16, 2009

(30) Foreign Application Priority Data
Jun. 10, 2005  (FR) ...................................... 05 51574

(51) Int. Cl.
*H01L 51/54* (2006.01)
(52) U.S. Cl. ......................... 313/504; 313/506; 428/690
(58) Field of Classification Search .................. 313/504, 313/506; 428/690
See application file for complete search history.

(56) References Cited

U.S. PATENT DOCUMENTS

| | | | |
|---|---|---|---|
| 5,093,698 A * | 3/1992 | Egusa | 257/40 |
| 5,601,903 A * | 2/1997 | Fujii et al. | 428/212 |
| 6,013,384 A | 1/2000 | Kido et al. | |
| 6,203,933 B1 * | 3/2001 | Nakaya et al. | 428/690 |
| 6,399,224 B1 * | 6/2002 | Li | 428/690 |
| 6,528,188 B1 * | 3/2003 | Suzuki et al. | 428/690 |
| 6,589,673 B1 | 7/2003 | Kido et al. | |

(Continued)

FOREIGN PATENT DOCUMENTS

| | | |
|---|---|---|
| EP | 1017118 A2 * | 7/2000 |
| EP | 1071145 | 1/2001 |

(Continued)

OTHER PUBLICATIONS

Kawamura et al., JP 2000315580, Nov. 14, 2000.*

(Continued)

*Primary Examiner* — Nimeshkumar Patel
*Assistant Examiner* — Steven Horikoshi
(74) *Attorney, Agent, or Firm* — Robert D. Shedd; Jeffrey M. Navon

(57) ABSTRACT

The diode comprises:
  a first layer based on a first organic material, which is n-doped in a zone of this layer that is in contact with a cathode,
  a second layer based on a second organic material, which is p-doped in a zone of this layer that is in contact with an anode,
  and an electroluminescent zone which is incorporated in one of the layers and is in contact with the other layer, and which is neither n-doped nor p-doped.

A high-yield diode is thus obtained in a particularly economical way.

7 Claims, 5 Drawing Sheets

U.S. PATENT DOCUMENTS

| | | | |
|---|---|---|---|
| 6,734,457 | B2 | 5/2004 | Yamazaki et al. |
| 6,867,538 | B2 | 3/2005 | Adachi et al. |
| 7,052,785 | B2 | 5/2006 | Begley et al. |
| 2001/0005021 | A1* | 6/2001 | Fukuyama et al. ............ 257/103 |
| 2001/0023029 | A1* | 9/2001 | Shi et al. ...................... 428/690 |
| 2002/0021268 | A1* | 2/2002 | Yamazaki et al. .............. 345/80 |
| 2002/0027416 | A1* | 3/2002 | Kim et al. ..................... 313/506 |
| 2002/0028351 | A1* | 3/2002 | Wang et al. ................... 428/690 |
| 2002/0071963 | A1* | 6/2002 | Fujii .............................. 428/690 |
| 2002/0086181 | A1* | 7/2002 | Lee-Mi et al. ................ 428/690 |
| 2002/0113545 | A1* | 8/2002 | Adachi et al. ................. 313/504 |
| 2002/0146590 | A1 | 10/2002 | Matsuo et al. |
| 2002/0190250 | A1* | 12/2002 | Grushin et al. ................. 257/40 |
| 2003/0111666 | A1* | 6/2003 | Nishi et al. ...................... 257/79 |
| 2003/0146693 | A1* | 8/2003 | Ishihara et al. ............... 313/504 |
| 2004/0007969 | A1* | 1/2004 | Lu et al. ........................ 313/501 |
| 2004/0031958 | A1 | 2/2004 | Wu et al. |
| 2004/0056266 | A1* | 3/2004 | Suh et al. ......................... 257/99 |
| 2004/0062949 | A1 | 4/2004 | Pfeiffer et al. |
| 2004/0076853 | A1* | 4/2004 | Jarikov ......................... 428/690 |
| 2004/0124766 | A1* | 7/2004 | Nakagawa et al. ........... 313/504 |
| 2004/0150330 | A1* | 8/2004 | Suh ............................... 313/506 |
| 2004/0251816 | A1 | 12/2004 | Leo et al. |
| 2005/0046337 | A1* | 3/2005 | Chin et al. .................... 313/504 |
| 2005/0084712 | A1 | 4/2005 | Kido et al. |
| 2006/0231843 | A1* | 10/2006 | Qin et al. ......................... 257/79 |

FOREIGN PATENT DOCUMENTS

| | | |
|---|---|---|
| EP | 1347518 | 9/2003 |
| JP | 6158038 A | 6/1994 |
| JP | 765958 A | 3/1995 |
| JP | 11135262 A2 | 5/1999 |
| JP | 2000315580 A * | 11/2000 |
| JP | 2001244079 A | 9/2001 |
| JP | 200256985 A | 2/2002 |
| JP | 200293577 A | 3/2002 |
| JP | 2002235077 A | 8/2002 |
| JP | 2004522276 A | 7/2004 |
| JP | 2004253355 A | 9/2004 |
| JP | 2004339136 A | 12/2004 |
| JP | 2005101002 A2 | 4/2005 |
| JP | 2005101004 A2 | 4/2005 |
| JP | 2005123095 A | 5/2005 |
| JP | 2007512685 T2 | 5/2007 |
| WO | 02091814 A2 | 11/2002 |
| WO | WO 03100880 A2 * | 12/2003 |
| WO | 2005048370 A1 | 5/2005 |

OTHER PUBLICATIONS

Spehr et al., Highly efficient light emitters based on the spiro concept, 2003, Organic Electronics, vol. 4, pp. 61-69.*

He et al., High-efficiency and low-voltage p-i-n electrophosphorescentn organic light-emitting diodes with double-emission layers, 2004, Applied Physics Letters, vol. 85, No. 17, pp. 3911-3913.*

Chimed Ganzorig et al: "Improved drive voltages of organic electroluminescent devices with an efficient p-type aromatic diamine hole-injection layer"; Applied Physics Letters, AIP, American Institute of Physics, US, vol. 77, No. 25, Dec. 18, 2000; pp. 4211-4213.

K. Harada et al: "Realization of organic pn-homojunction using a novel n-type doping technique", Proceedings of the SPIE, US, vol. 5464, Sep. 2004, pp. 1-9.

Search Report Dated Sep. 7, 2006.

Endo et al., Organic electroluminescent devices with a vacuum-deposited lewis-acid-doped hole-injecting layer, Japanese journal of applied physics, vol. 41, pp. 358-360 Part 2, No. 3B, Mar. 15, 2002.

Kido et al., Bright organic electroluminescent devices having a metal-doped electron-injecting layer Applied physics letters, vol. 73, No. 20, 2866-2868.

* cited by examiner

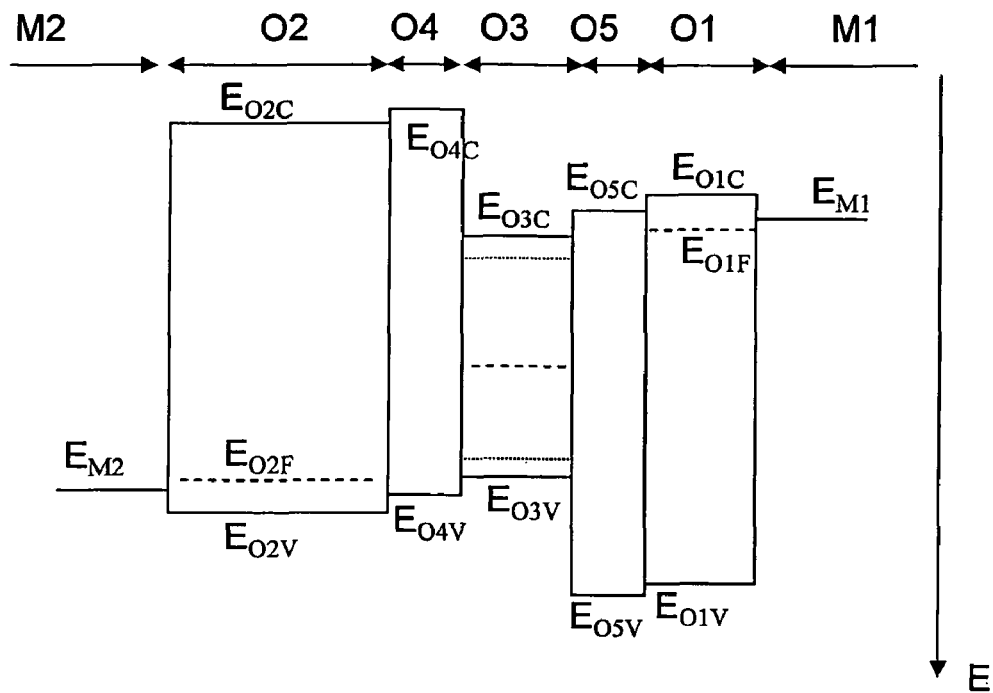
Fig.1 – Prior Art
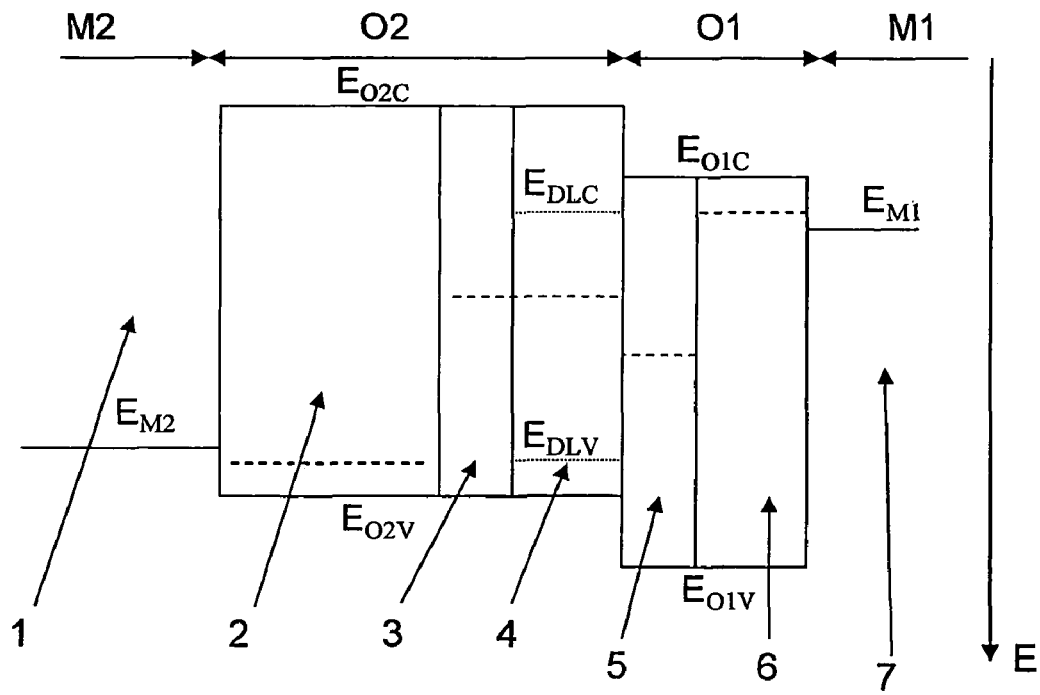
Fig.2

LIGHT-EMITTING ORGANIC DIODE COMPRISING NOT MORE THAN TWO LAYERS OF DIFFERENT ORGANIC MATERIALS

This application claims the benefit, under 35 U.S.C. §365 of International Application PCT/EP2006/063069, filed Jun. 9, 2006, which was published in accordance with PCT Article 21(2) on Dec. 14, 2006 in French and which claims the benefit of French patent application Ser. No. 0551574, filed Jun. 10, 2005.

The invention relates to an organic light-emitting diode. The invention also relates to illumination or image-display panels comprising a network of these diodes supported by the same substrate. Document EP0498979 B1—TOSHIBA discloses an organic light-emitting diode comprising:
- a substrate,
- a cathode made of conductive material M1 and an anode made of conductive material M2,
- a first layer in contact with the cathode, based on a first organic material O1 which is n-doped,
- a second layer in contact with the anode, based on a second organic material O2 which is p-doped,
- and a third layer interposed between the first layer and the second layer, based on a third organic material O3 which is neither n-doped nor p-doped.

Referring to FIG. 1, Documents US2004-062949—NOVALED and U.S. Pat. No. 6,566,807 add blocking layers to this structure of doped layers: electron blocking layer of material O4 interposed between the hole injection layer O2 and the electroluminescent layer O3, hole blocking layer of material O5 interposed between the electron injection layer O1 and the electroluminescent layer O3.

These documents specify the required electronic properties of the various organic materials of the different layers.

In order to define these characteristics, the following parameters in particular defined:
the work function of the conductive material of the cathode $E_{M1}$ and that of the conductive material of the anode $E_{M2}$;
the energy of the LUMO level (Lowest Unoccupied Molecular Orbital), that of the HOMO level (Highest Occupied Molecular Orbital) respectively of the basic material O1 of the n-doped layer: $E_{O1C}$, $E_{O1V}$, of the basic material O5 of the hole blocking layer: $E_{O5C}$, $E_{O5V}$, of the basic material O3 of the electroluminescent layer: $E_{O3C}$, $E_{O3V}$, of the basic material O4 of the electron blocking layer: $E_{O4C}$, $E_{O4V}$, and of the basic material O2 of the p-doped layer: $E_{O2C}$, $E_{O2V}$; all these levels being evaluated positively relative to the energy of an electron in a vacuum at infinity (the same basis as for the work function).

As illustrated in FIG. 1, in order to obtain optimal functioning of the diode according to these documents, it is important that:
$E_{M1} \geq E_{O1C}$, which means that there is a potential barrier at the interface between the cathode and the n-doped organic layer, and that the junction at this interface is not ohmic; the height of the potential barrier may be limited to 0.5 eV or, in the case of a higher barrier, the doping level may be adapted accordingly in order to facilitate passage of the electrons across this barrier; if $E_{O1F}$ denotes the Fermi level of the electrons in the doped zone as the centroid of the occupied levels, then it is preferable for the doping level to be such that $E_{O1F} \geq E_{M1}$;

$E_{M2} \leq E_{O2V}$, which means that there is a potential barrier at the interface between the anode and the p-doped organic layer, and that the junction at this interface is not ohmic; the height of the potential barrier may be limited to 0.5 eV or, in the case of a higher barrier, the doping level may be adapted accordingly in order to facilitate passage of the holes across this barrier; if $E_{O2F}$ denotes the Fermi level of the holes in the doped zone as the centroid of the occupied levels, then it is preferable for the doping level to be such that $E_{O2F} \leq E_{M2}$. According to the conditions above the carriers, i.e. electrons or holes, are therefore injected by a tunnel effect across a so-called "depletion zone" lying in the doped zone in immediate proximity to the interface with the electrode i.e. cathode or anode; furthermore, as taught by Document EP0498979 B1 (page 9, lines 11-12), the thickness of this "depletion zone" is very small i.e. generally less than 10 nm; this thickness clearly depends on the materials used and on the doping levels.

As illustrated in FIG. 1, in order to obtain optimal functioning of the diode, it is also important that:
$E_{O5C} \geq E_{O1C} - 0.3$ eV, so as to facilitate passage of the electrons at the interface between the n-doped layer of material O1 and the hole blocking layer of material O5, and preferably $E_{O5C} \leq E_{O1C} + 0.3$ eV in order to limit the electrical losses at this interface;

$E_{O4V} \leq E_{O2V} + 0.3$ eV, so as to facilitate passage of the holes at the interface between the p-doped layer of material O2 and the electron blocking layer of material O4, and preferably $E_{O4V} \geq E_{O2V} - 0.3$ eV in order to limit the electrical losses at this interface;

As illustrated in FIG. 1, in order to obtain optimal functioning of the diode, it is also important that:
$E_{O4C} < E_{O3C}$, so as to efficiently block the electrons at the interface between the electroluminescent layer of material O3 and the electron blocking layer of material O4;

$E_{O4V} + 0.3$ eV $\geq E_{O3V}$, so as to allow passage of the holes at this interface, and preferably $E_{O4V} - 0.3$ eV $\leq E_{O3V}$ in order to limit the electrical losses at this interface;

$E_{O5V} \geq E_{O3V}$, so as to efficiently block the holes at the interface between the electroluminescent layer of material O3 and the hole blocking layer of material O5;

$E_{O5C} - 0.3$ eV $\leq E_{O3C}$, so as to allow passage of the electrons at this interface, and preferably $E_{O5C} + 0.3$ eV $\geq E_{O3C}$ in order to limit the electrical losses at this interface.

The advantages offered by using doped organic layers for injecting and transporting charges, i.e. electrons or holes, in the electroluminescent emissive layer, instead of charge injection and transport layers of the prior art, are in particular the following:
high electrical yield;
widening the selection of organic semiconductor materials which may be used, since a LUMO level lower than the work function of the material of the cathode is no longer prohibitive for the injection of electrons, and since a HOMO level higher than the work function of the material of the anode is no longer prohibitive for the injection of holes,
widening the range of thicknesses which may be used for the charge injection or transport layers, without entailing prohibitive ohmic losses owing to the high conductivity of the doped layers; in particular, this makes it possible to adapt the thickness better in order to optimize the extraction of light by interference effects.

One drawback of the light-emitting diode structures described in the documents cited above is that, in order to fully exploit the advantages offered by the doped layers both on the cathode side and on the anode side, it is expedient to use at least three different organic materials. This is because the structures with only two organic materials, as described with reference to FIGS. 9 and 12 of Document EP0498979 B1—TOSHIBA are electronically n- or p-doped on only one side, either the anode side or the cathode side, which does not allow the advantages offered by the doped layers to be fully exploited. All the other structures described in these documents comprise at least three different organic materials between the cathode and the anode.

It is an object of the invention to provide a solution to this problem.

To this end, the invention relates to an organic light-emitting diode, comprising:
a cathode and an anode,
and, interposed between said cathode and said anode,
a first layer in contact with said cathode, based on a first organic material which is n-doped in a zone of this layer that is in contact with this cathode,
a second layer in contact with said anode, based on a second organic material which is p-doped in a zone of this layer that is in contact with this anode, characterized in that said first layer and/or said second layer comprise an electroluminescent zone which is in contact with the other layer, and which is neither n-doped nor p-doped.

The p-type and n-type dopants are electronic dopants, as opposed to the luminescent dopant(s) with which the organic material of the electroluminescent zone is generally doped.

The diode according to the invention is much easier and more economical to produce than the diodes of the prior art since they comprise only two layers of organic material which are generally different, and since they have a high yield owing to the use of doped semiconductor materials both for injecting and transporting the electrons on the cathode side and for injecting and transporting the holes on the anode side.

The invention applies more particularly to the cases in which the organic materials are not polymerized, and can therefore be deposited by a vacuum evaporation; the various zones may then advantageously be obtained by simple dopant co-evaporation.

The term basic material is intended to mean the "host" material of each zone: thus, the same layer based on a given material may contain a doped zone comprising for example 5% by weight of an n-type electronic dopant distributed in this basic material, a barrier zone not doped with an electronic or luminescence dopant, comprising only this basic material except for impurities due to diffusion from the adjacent zones, and a doped zone comprising for example 8% by weight of a luminescent dopant distributed in this basic material: these three zones are based on the same "host" material. Each doped zone may contain a plurality of dopants.

Said diode therefore preferably does not contain any other layer interposed between said cathode and said anode, which might be based on a material different both to the first organic material and to the second organic material. According to one variant, the first and second organic materials are identical (see FIG. 5). Preferably however, and in contrast to the diodes described in documents EP1347518 (see fourth embodiment page 10), EP1071145, which describes homojunctions, HARADA K "realization of organic pn-homojunction"-Proceeding of the SPIE, vol. 5464, September 2004, pages 1-9 (XP002314797), said second organic material is different to said first organic material. Using two different materials makes it possible to obtain better yields while limiting the complexity of the fabrication method.

The first or second layer, or both layers, therefore have a doped zone or "slice" which is located in the vicinity of an electrode of the diode, i.e. a cathode or anode, and an undoped zone or "slice" which is luminescent and located in the vicinity of the other layer.

The electronic dopant of the n- or p-doped zones is adapted in a manner known per se in order to provide additional energy levels for the electrons in the vicinity of the LUMO level if n-type doping is involved, or in order to provide additional energy levels for the holes in the vicinity of the HOMO level if p-type doping is involved. These n- or p-type dopants are thus referred to as "electronic" dopants as opposed to the "luminescent" dopants described below.

The diode may have a single luminescent zone which forms part of the first layer (see FIG. 3), or a single luminescent zone which forms part of the second layer (see FIG. 2), or two luminescent zones, one forming part of the first layer and the other forming part of the second layer (see FIG. 4). The electroluminescent nature of the electroluminescent zone is in particular obtained in a manner known per se by luminescent doping of the organic material of the layer to which this zone belongs, with the aid of at least one fluorescent and/or phosphorescent dopant. A coloring dopant may be added in order to adapt the luminescence emission spectrum of the diode. Certain materials intrinsically have electroluminescent properties and at the same time may also be transporters of one of the carriers, i.e. electrons or holes. A dopant may be associated with this "host" material, but this is not necessary. The intrinsically luminescent "host" luminescent materials may be fluorescent or phosphorescent.

Preferably, the thickness of the n-doped zone of the first layer and that of the p-doped zone of the second layer are more than 20 nm. These high thicknesses make it possible to optimize the extraction of a light without substantially increasing the ohmic losses, since the doping imparts a high conductivity to these zones.

Preferably, the diode according to the invention also comprises at least one diffusion barrier zone which is not substantially doped, and which is interposed between one of said doped zones and one of said electroluminescent zones. Depending on the barrier in question, the material of the barrier zone is either the basic material of the first layer or the basic material of the second layer. In the case of fabrication by vacuum evaporation as mentioned above, this zone is advantageously produced while avoiding any dopant co-evaporation. Owing to the diffusion of dopant(s) coming from adjacent zones (doped zone and/or electroluminescent zone), this barrier zone may contain one or more of the dopants of these adjacent zones in a small proportion, and particularly in a much smaller proportion than in these adjacent zones.

Preferably, the thickness of each diffusion barrier zone is less than 20 nm. The thickness of this zone is preferably much less than that of the doped zones, in order to limit the ohmic losses in the thickness of the diode.

Preferably, if the cathode and the anode are made of conductive material M1 and M2 respectively, and if the work functions of the material M1 and of the material M2 are respectively denoted $E_{M1}$ and $E_{M2}$, if $E_{O1C}$ denotes the electron affinity or energy of the LUMO level and $E_{O1V}$ denotes the ionization potential or energy of the HOMO level of the first organic material O1, and $E_{O2C}$ denotes the energy of the LUMO level and $E_{O2V}$ denotes the energy of the HOMO level of the second organic material O2, all these levels being evaluated positively relative to the energy of an electron in a vacuum at infinity, then the conductive material of the cathode, that of the anode, and the first and second organic materials are selected so that: $E_{M1} \geq E_{O1C}$ and $E_{M2} \leq E_{O2V}$. These conditions correspond to the non-ohmic nature of the junction between the cathode and the n-doped zone of the first layer, and of the junction between the anode and the p-doped zone of the second layer. Despite the potential barrier at these junctions, but owing to the electronic doping of the organic materials of the first and second layers which contribute to reducing the thickness of this potential barrier, the electrical current crosses these junctions with reduced electrical losses.

Preferably, the conductive material of the cathode, that of the anode, and the first and second organic materials are selected so that furthermore: $E_{O2C} < E_{O1C}$ and/or $E_{O1V} > E_{O2V}$.

These conditions make it possible to block the electrons and/or the holes at the interface between the two layers. In order to achieve more efficient blocking, it is preferable for the difference between these LUMO levels on the one hand, and these HOMO levels on the other hand, to be more than 0.5 eV.

It is not categorically necessary to achieve both blocking of the holes on the cathode side and blocking of the electrons on the anode side. Specifically, in the case in which the first organic material (on the cathode side) conducts electrons better than holes, it is less useful to block the holes; in the case in which the second organic material (on the anode side) conducts holes better than electrons, it is less useful to block the electrons.

Preferably, the at least one electroluminescent zone comprises at least one luminescent dopant which is selected so that its LUMO level defined by $E_{DLC}$ and its HOMO level defined by $E_{DLV}$ such that $E_{DLV} - E_{DLC} < E_{O1V} - E_{O1C} + 0.3$ eV in the case of a luminescent zone belonging to the first layer, and such that $E_{DLV} - E_{DLC} < E_{O2V} - E_{O2C} + 0.3$ eV in the case of a luminescent zone belonging to the second layer.

The luminescent dopants have a LUMO level and/or a HOMO level which is not contained in the forbidden gap of the "host" material in which they are incorporated; distinction is made between the forbidden gap of the "host" material which is delimited by the HOMO level and the LUMO level of this material, and the forbidden gap of the luminescent dopant which is delimited by the HOMO level and the LUMO level belonging to this dopant; for efficient luminescent doping, it is important for the width of the forbidden gap of this dopant to be less than the width of the forbidden gap of the "host" material to within 0.3 eV. Preferably, the LUMO level and the HOMO level of this dopant are both contained in the forbidden gap of the material in which they are incorporated, which improves the yield of the diode.

Whenever a luminescent or coloring dopant has a LUMO level and/or a HOMO level contained in the forbidden gap of the material in which it is incorporated, this level cannot contribute to n- or p-type electronic doping. It is therefore possible to distinguish the electronic dopants of the n- or p-doped zones clearly from the luminescent dopants of the luminescent zones.

Preferably, the first and second organic materials, and the at least one luminescent dopant, are selected so that $E_{DLV} - E_{DLC} < E_{O2V} - E_{O1C} + 0.3$ eV and so that $E_{DLV} - E_{DLC} < E_{O1V} - E_{O2C} + 0.3$ eV.

These conditions advantageously make it possible to limit the formation of "exciplex", i.e. to limit the de-excitation or recombination of the electron-hole pairs via the coincidence of two energy levels corresponding to different materials.

Preferably, the first organic material is selected from the group consisting of Bphen, BCP, DPVBi, TPBi and Alq3, and the second organic material is selected from the group consisting of Spiro-TAD, TAZ and TCTA.

BCP, DPVBi and TPBi correspond respectively to 2,9-dimethyl-4,7-diphenyl-1,10-phenanthroline (or bathocuproine), 4,4-bis(2,2-diphenylrylene), and 2,2',2''-(1,3,5-phenylene)tris[1-phenyl-1H-benzimidazole]; these organic materials have a sufficiently wide forbidden gap (separation between the level of the HOMO and the level of the LUMO) in order to form "host" materials highly suitable for receiving luminescent dopants which emit blue-colored light.

The invention also relates to an image-display or illumination panel, characterized in that it comprises a plurality of diodes according to the invention. The panel obtained is particularly economical and has a very good yield.

The invention will be understood more clearly on reading the following description, given by way of nonlimiting example and with reference to the appended figures, in which:

FIG. 1, already described, represents an organic light-emitting diode structure according to the prior art;

FIGS. 2 to 4 represents three different embodiments of diodes with two organic layers according to the invention: with a single electroluminescent zone belonging to the organic layer on the anode side in the case of FIG. 2, with a single electroluminescent zone belonging to the organic layer on the cathode side in the case of FIG. 3, and with two adjacent electroluminescent zones in the case of FIG. 4, one belonging to the organic layer on the anode side and the other belonging to the organic layer on the cathode side;

FIG. 5 represents a particular embodiment in which the two organic materials O1 and O2 are identical; the single material is then referred to as O;

FIG. 6 describes an electrical measurement device making it possible to inspect the electronic doping level of organic layers;

In order to simplify the description and highlight the differences and advantages which the present invention has over the prior state of the art, identical references are used for the elements which fulfill the same functions.

The performance and the yield of the organic diode which is obtained depend largely on the choice of the materials of the cathode, the anode, the organic material O1 on the cathode side and the organic material O2 on the anode side; the following terminology is used:

$E_{M1}$ denotes the work function of the material M1 of the cathode, and $E_{M2}$ that of the material M2 of the anode, $E_{O1C}$ denotes the energy of the LUMO level and $E_{O1V}$ denotes the energy of the HOMO level of the material O1, $E_{O2C}$ denotes the energy of the LUMO level and $E_{O2V}$ denotes the energy of the HOMO level of the material O2, and $E_{DLC}$ denotes the energy of the LUMO level and $E_{DLV}$ denotes the energy of the HOMO level of the luminescent dopant.

Figure 4:
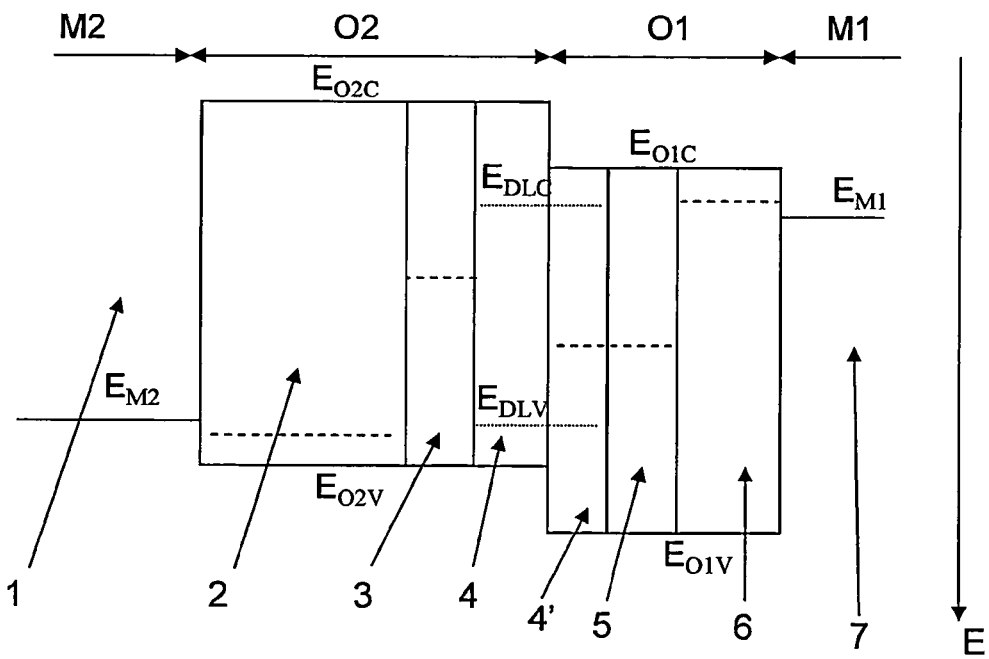

These materials and this dopant are preferably selected so that:

a) $E_{M1} \geq E_{O1C}$ and $E_{M2} \leq E_{O2V}$; these conditions express the fact that the junctions between electrodes and organic materials are not ohmic;

b) b-1) $E_{O2C} < E_{O1C}$ and b-2) $E_{O1V} > E_{O2V}$; these conditions express the fact that the electrons flowing in the first layer are discouraged from entering the second layer, and that the holes flowing in the second layer are discouraged from entering the first layer;

c) $E_{DLV}-E_{DLC}<E_{O1V}-E_{O1C}+0.3$ eV if the luminescent dopant dopes a zone of the first layer, and $E_{DLV}-E_{DLC}<E_{O2V}-E_{O2C}+0.3$ eV if the luminescent dopant dopes a zone of the second layer; as indicated above and as illustrated in FIG. 4, both cases may occur simultaneously;

d) d-1) $E_{DLV}-E_{DLC}<E_{O2V}-E_{O1C}+0.3$ eV and d-2) $E_{DLV}-E_{DLC}<E_{O1V}-E_{O2C}+0.3$ eV, which limits the exciplex formation and makes it possible to improve the yield.

The choice of the materials having been made, the following stack is subsequently produced on a glass substrate or on an active matrix, preferably by vacuum evaporation:

an anode 1, generally with a thickness of between 10 nm and 200 nm;

a layer based on organic material O2, generally with a thickness of between 30 nm and 200 nm; in a first step of depositing the organic material O2, a hole donor (i.e. electron acceptor) dopant is co-evaporated so as to form a p-doped zone 2 with a thickness of more than 20 nm; optionally, in a second step of vacuum evaporating the same organic material O2, the deposition is then continued without dopant co-evaporation so as to form an undoped barrier zone 3 with a thickness of less than 20 nm;

a layer based on organic material O1, generally with a thickness of between 30 nm and 200 nm; in an optional first step of vacuum evaporating the organic material O1, the material O1 is deposited without dopant co-evaporation so as to form an undoped barrier zone 5 with a thickness of less than 20 nm; in a second step of vacuum evaporating the same organic material O1, the deposition is continued while co-evaporating an electron donor dopant so as to form an n-doped zone 6 with a thickness of more than 20 nm;

a cathode 7, generally with a thickness of between 10 nm and 200 nm. At the end of the deposition of organic material O2 and/or at the start of the deposition of organic material O1, this deposition is carried out while co-evaporating an electroluminescent dopant so as to form at least one electroluminescent zone 4, 4' at the interface between the two layers, generally having a thickness of greater than or equal to 20 nm.

After the deposition for forming all the zones in each layer, an encapsulation layer intended to protect the previously deposited organic layers against risks of degradation, particularly by oxygen and humidity of the ambient air, is subsequently deposited in a manner known per se.

A diode according to the invention is obtained.

Figure 3:
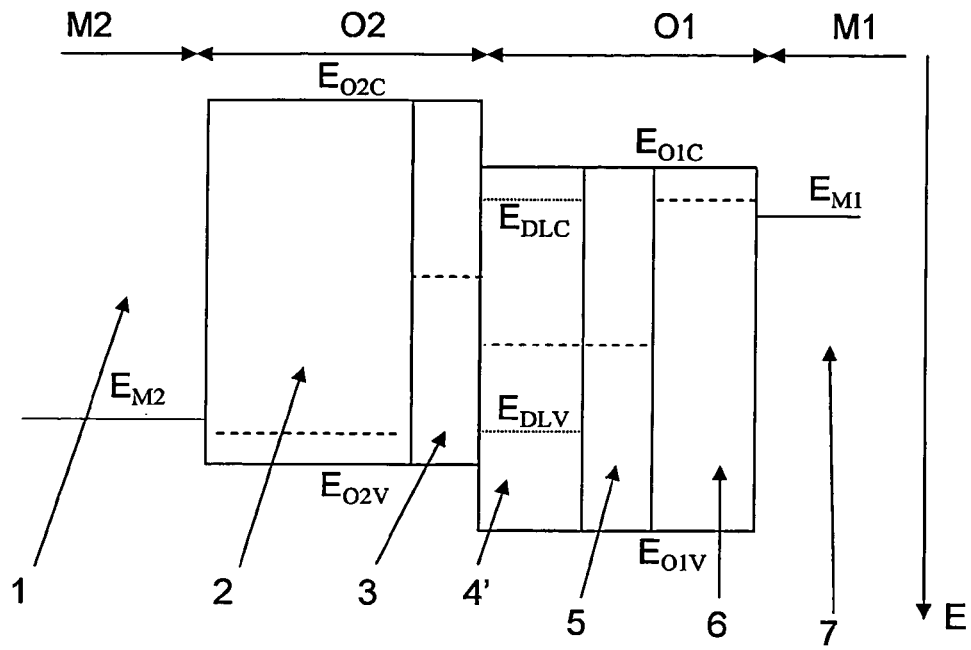
Figure 5:
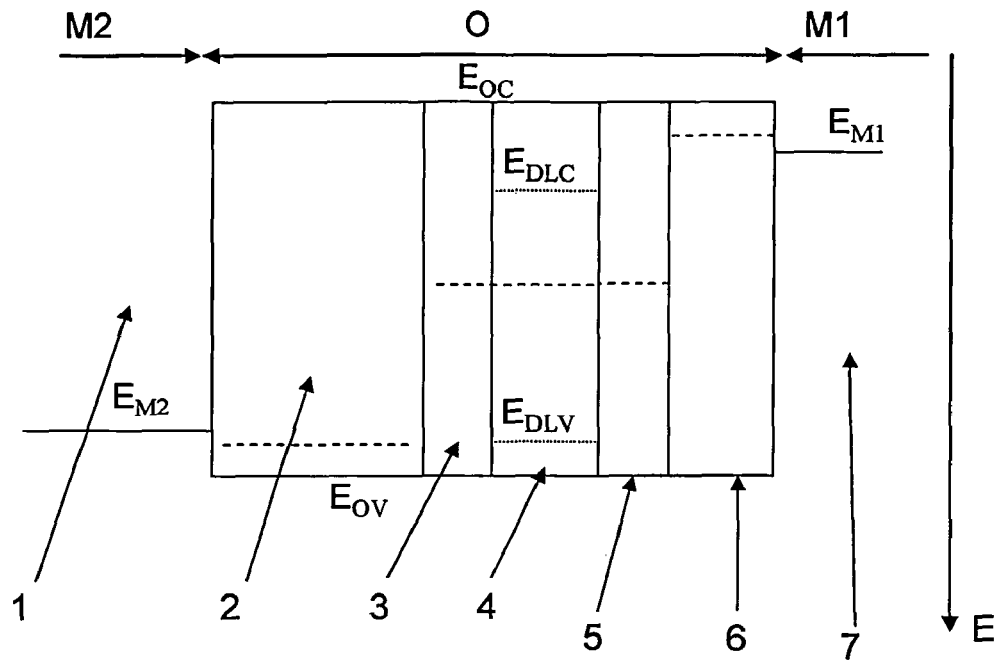

Referring to FIGS. 2 to 5, three different embodiments can be found of diodes with only at most two organic layers according to the invention: with a single electroluminescent zone 4 belonging to the organic layer of material O2 on the anode side in the case of FIG. 2, with a single electroluminescent zone 4' belonging to the organic layer of material O1 on the cathode side in the case of FIG. 3, and with two adjacent electroluminescent zones 4, 4' in the case of FIG. 4, one 4 belonging to the organic layer of material O2 on the anode side and the other 4' belonging to the organic layer of material O1 on the cathode side; lastly, referring to FIG. 5, a particular embodiment can be seen in which the two organic materials O1 and O2 are identical, the single material then being referred to as O. The embodiments of FIGS. 2 to 4 are preferred. According to one variant of the invention which is applicable to all the embodiments described above, the structure is reversed, i.e. the cathode is deposited first of all, then the layer of material O1, then the layer of material O2, and then the anode.

It should be noted that, although the barrier zones 3, 5 described above offer an advantage due to blocking of the electrons or holes, these barrier zones nevertheless remain optional.

The diodes obtained have very good yields and a very good efficiency, while they are particularly economical to fabricate because they only comprise at most two organic layers based on different organic materials.

The following examples illustrate the invention.

EXAMPLE 1

This example is intended to illustrate an embodiment of the invention as represented in FIG. 3, in which the diode comprises only a single luminescent zone which is contained in the layer based on material O1, which is in contact with the cathode.

Figure 6:
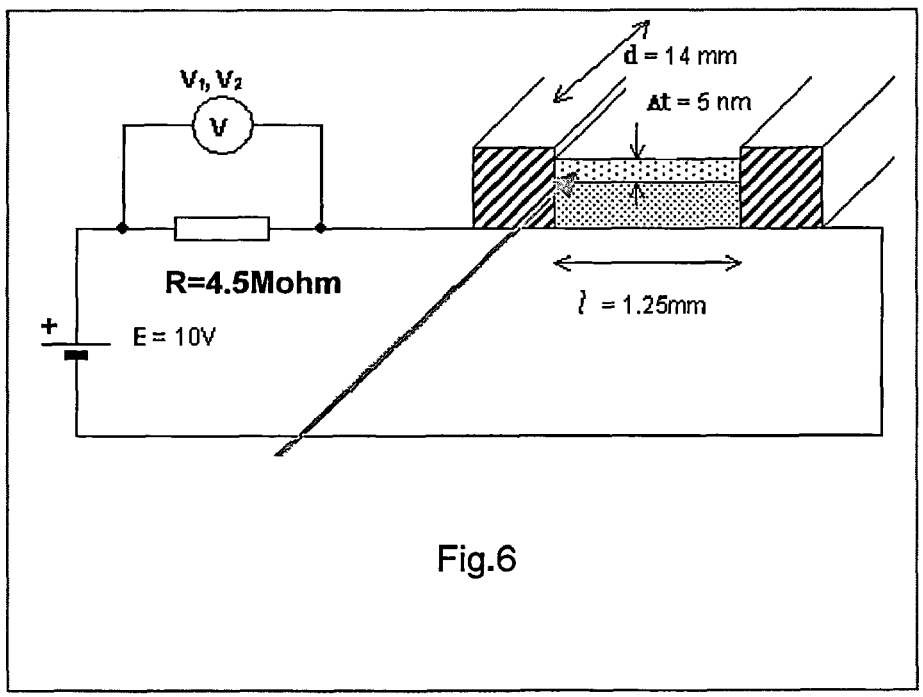

By vacuum evaporation (except for the anode), the following stack is produced in a known way on a glass substrate:

an ITO anode with a thickness of 150 nm, for example by cathodic sputtering;

a layer based on organic material O2=Spiro-TAD, an abbreviation which corresponds to the compound named 2,2',7,7'-tetrakis(diphenyl-amine)-9,9'-spiro-bifluorene, and with a total thickness of 45 nm; in a first Spiro-TAD vacuum evaporation step intended to form a p-doped zone 2, a hole donor (electron acceptor) dopant is co-evaporated, here F4-TCNQ, an abbreviation which corresponds to the compound named tetra-fluoro-tetra-cyano-quino-dimethane, so that the thickness of the p-doped zone is approximately 35 nm; the doping level is adjusted to about 2% by weight, with the aid of a conventional device which is based on a quartz balance and is integrated in the deposition chamber; in a second step of vacuum evaporating the same Spiro-TAD, which is intended to form a barrier zone 3, the deposition is subsequently continued without dopant co-evaporation so as to obtain an undoped barrier zone 3 with an approximate thickness of 10 nm;

a layer based on organic material O1=Bphen, an abbreviation which corresponds to the compound named bathophenanthroline, or more precisely 4,7-diphenyl-1,10-phenanthroline, and with an approximate total thickness of 72 nm; in a first BPhen vacuum evaporation step intended to form an electroluminescent zone 4', a luminescent dopant formed by rubrene is co-evaporated so as to obtain doping with about 20% by weight of rubrene over an approximate 32 nm thickness of the electroluminescent zone 4'; in a second step of vacuum evaporating the same BPhen, which is intended to form another barrier zone 5, the deposition is subsequently continued without dopant co-evaporation so as to obtain an undoped barrier zone 3 with an approximate thickness of 5 nm; in a third Bphen vacuum evaporation step intended to form an n-doped zone 6, the Bphen deposition is continued while co-evaporating an electron donor formed by cesium so as to obtain an approximate 35 nm thickness of the doped zone 6 and a doping level lying between 10 and 20 mV per 10 nm thickness of the deposited layer; this doping level is evaluated as follows, using the measurement device represented in FIG. 6; in the deposition chamber, the material O1 is deposited simultaneously between two metal electrodes (hatched section in the figure) which are separated by I=1.25 mm, extend over d=14 mm and which are connected to a resistance measurement device which comprises a generator of DC voltage E=10 V and a reference resistor R=4.5 MΩ, which are connected in series; the variation in the voltage across the terminals of the resistor as a function of the thickness deposited (taken in steps of 10 nm here) gives a value proportional to the level of cesium doping.

an aluminum cathode 7 with a thickness of 150 nm.

An encapsulation layer (not shown) intended to protect the previously deposited organic layers against risks of degradation, particularly by oxygen and humidity of the ambient air, is subsequently deposited in a manner known per se.

A diode according to the invention is obtained.

If $E_{M1}$=4.3 eV denotes the work function of aluminum, $E_{M2}$=4.5 to 5.0 eV denotes that of ITO, if $E_{O1C}$=3.0 eV denotes the energy of the LUMO level and $E_{O1V}$=6.3 eV denotes the energy of the HOMO level of BPhen, $E_{O2C}$=2.4 eV denotes the energy of the LUMO level and $E_{O2V}$=5.3 eV denotes the energy of the HOMO level of Spiro-TAD, $E_{DLC}$=3.0 eV denotes the energy of the LUMO level and $E_{DLV}$=5.3 eV denotes the energy of the HOMO level of the luminescent dopant rubrene, then it is found that the choice of the materials and the luminescent dopant corresponds to virtually all the advantageous conditions a) to d) according to the invention:

a) $E_{M1}$ (4.3) $\geq E_{O1C}$ (3.0) and $E_{M2}$ (4.5 to 5.0) $\leq E_{O2V}$ (5.3)
b) $E_{O2C}$ (2.4) $<<E_{O1C}$ (3.0) and $E_{O1V}$ (6.3) $>>E_{O2V}$ (5.3)
c) $E_{DLV}-E_{DLC}$ (=2.3 eV) $<E_{O2V}-E_{O2C}$+0.3 eV (=3.2 eV) since the luminescent dopant dopes a zone of the second layer;
d) $E_{DLV}-E_{DLC}$ (=2.3 eV) $<E_{O2V}-E_{O1C}$+0.3 eV (=2.6 eV) and $E_{DLV}-E_{DLC}<E_{O1V}-E_{O2C}$+0.3 eV.

Figure 7:
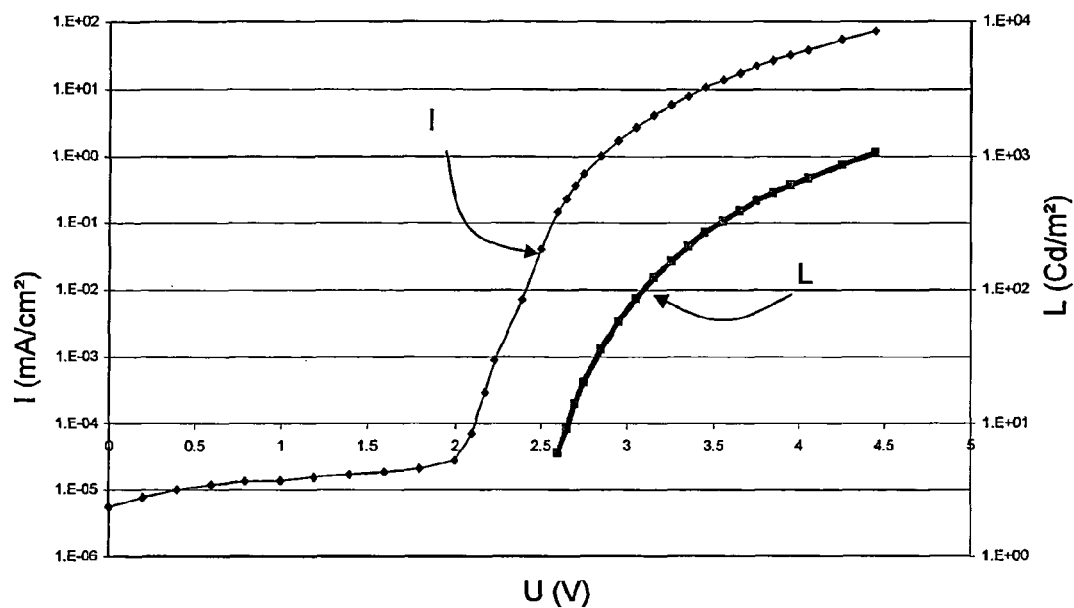
FIGS. 7 and 8 represent the electrical and luminous characteristics, as well as the yields, of the diodes obtained according to Example 1.
Figure 8:
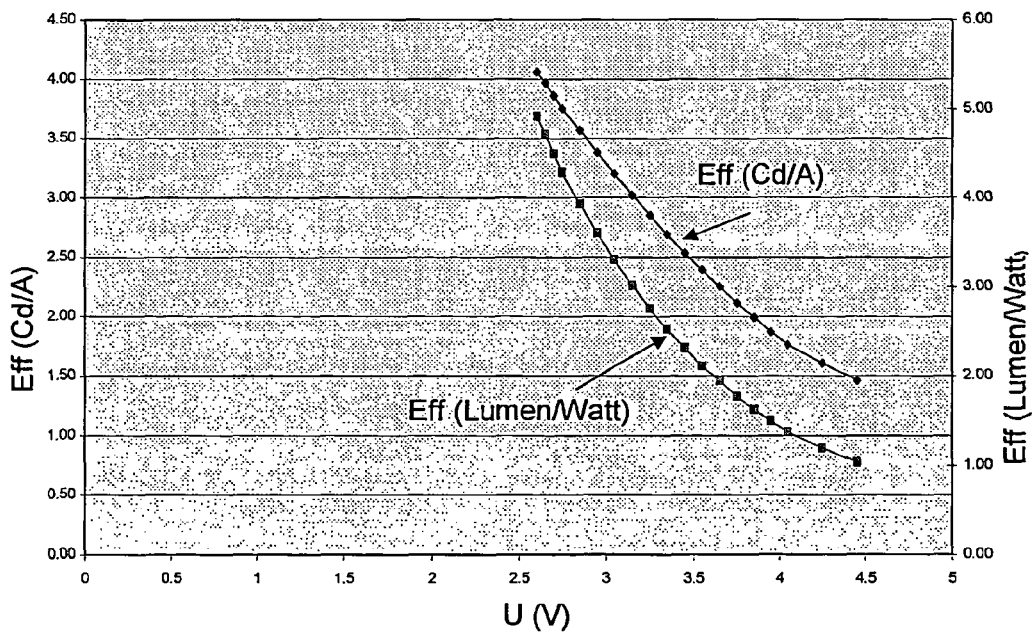

The electrical and luminous performances of the diode thus obtained are represented in FIGS. 7 and 8; FIG. 7 shows the value of the current I (mA/cm²) and the luminance L (Cd/m²) as a function of the voltage U (V) across the terminals of the diode: 1 mA/cm² gives 35.7 Cd/m² and requires a voltage of 2.85 V; FIG. 8 shows two values of luminous efficiency, one in Cd/A and the other in Lumen/Watt: at 100 Cd/m² and a voltage of 3.09 V, the efficiency is 3.12 Cd/A and 3.17 Lm/W.

It can therefore be seen that entirely acceptable performances and yields are obtained with a particularly simple and economical diode structure.

EXAMPLE 2

This example is intended to illustrate an embodiment of the invention as represented in FIG. 2, in which the diode comprises only a single luminescent zone which is contained in the layer-based on material O2, which is in contact with the anode.

The basic materials of the cathode, the first organic layer, the second organic layer, the anode and the luminescent dopant, are identical to those of Example 1. The procedure as in Example 1 is adopted, except that:

after the second step of depositing the layer based on organic material O2=Spiro-TAD during which a barrier layer 3 is produced, a third step of vacuum evaporating Spiro-TAD is added, which is intended to form an electroluminescent zone 4 by co-evaporating rubrene so as to obtain doping with about 20% by weight of rubrene over an approximate 32 nm thickness of the electroluminescent zone 4; the total thickness of the layer based on Spiro-TAD is then about 0.77 nm;

the first step of forming an electroluminescent zone in the layer based on organic material O1=Bphen is omitted, instead proceeding directly to the step of forming the barrier layer 5; the total thickness of the layer based on BPhen is then about 40 nm;

A diode according to the invention is obtained.

As in the case of Example 1 and since the materials and the dopant are identical, it is found that the choice of the materials and the luminescent dopant corresponds as before to all the advantageous conditions a) to d) according to the invention; only condition c) has changed since the luminescent dopant now dopes a zone of the first layer; this condition is well satisfied since: $E_{DLV}-E_{DLC}$(=2.3 eV)$<E_{O1V}-E_{O1C}$+0.3 eV (=3.6 eV).

Figure 9:
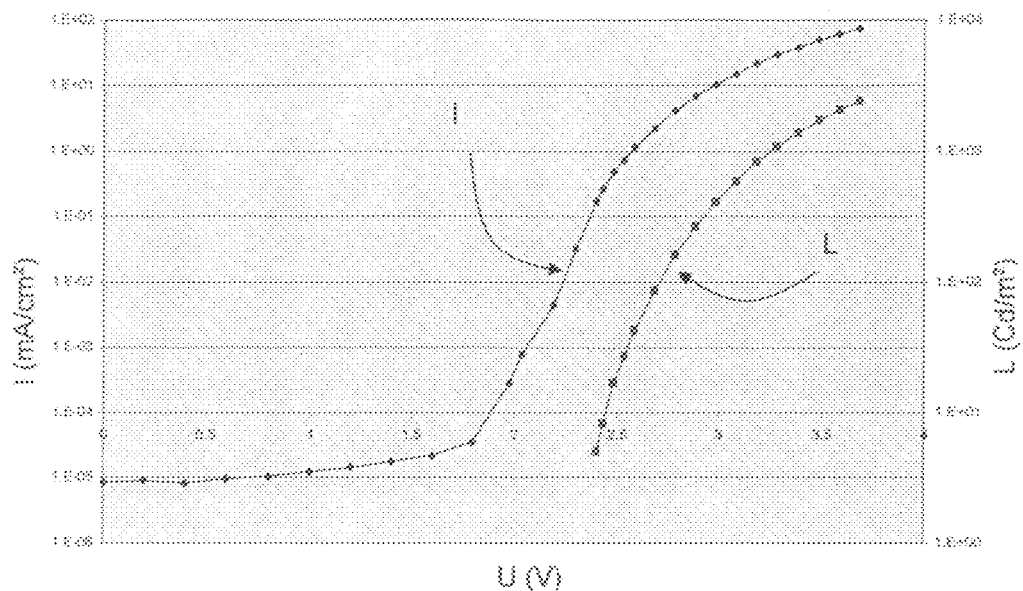
FIGS. 9 and 10 represent the electrical and luminous characteristics, as well as the yields, of the diodes obtained according to Example 2.
Figure 10:
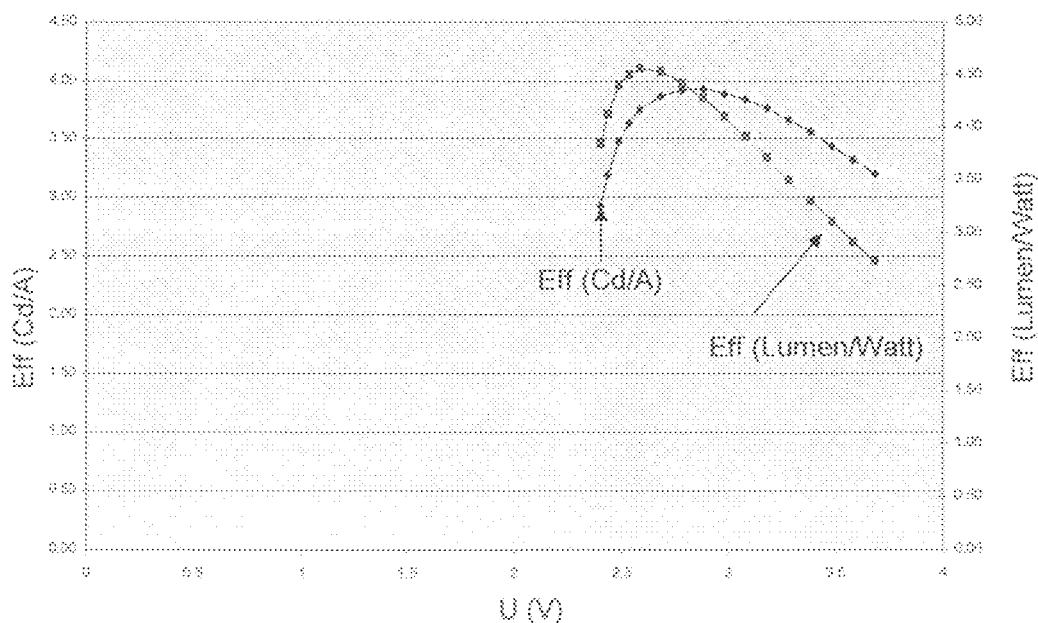

The electrical and luminous performances of the diode are represented in FIGS. 9 and 10; FIG. 9 shows the value of the current I (mA/cm²) and the luminance L (Cd/m²) as a function of the voltage U (V) across the terminals of the diode: 1 mA/cm² gives 37.1 Cd/m² and requires a voltage of 2.57 V; FIG. 10 shows two values of luminous efficiency, one in Cd/A and the other in Lumen/Watt: at 100 Cd/m² and a voltage of 2.7 V, the efficiency is 3.88 Cd/A and 4.51 Lm/W.

This second example therefore clearly illustrates the obtaining of entirely acceptable performances and yields with a particularly simple and economical diode structure.

EXAMPLE 3

This example is intended to illustrate another embodiment with reference to FIG. 2, in which the diode comprises only a single luminescent zone which is contained in the layer based on material O2, which is in contact with the anode. With the aid of a method comparable to that described in Example 2, using the same doping levels and the same thicknesses, the following stack is produced: ITO/F4TCNQ-doped TAZ/ TAZ/Irppy-doped TAZ/Bphen/Cs-doped Bphen/Al. The organic material of the second layer is TAZ here, an abbreviated name for 3-(4-biphenylyl)-4-phenyl-5-tert-butylphenyl-1,2,4-triazole. The luminescent dopant is Irppy here, an abbreviated name for tris[2-(2-pyridinyl)phenyl-C,N]-iridium.

If $E_{M1}$=4.3 eV denotes the work function of aluminum, $E_{M2}$=4.5 to 5.0 eV denotes that of ITO, if $E_{O1C}$=3.0 eV denotes the energy of the LUMO level and $E_{O1V}$=6.3 eV denotes the energy of the HOMO level of BPhen, $E_{O2C}$=2.6 eV denotes the energy of the LUMO level and $E_{O2V}$=6.6 eV denotes the energy of the HOMO level of TAZ, $E_{DLC}$=2.4 eV denotes the energy of the LUMO level and $E_{DLV}$=5.4 eV denotes the energy of the HOMO level of the luminescent dopant Irppy, then it is found that the choice of the materials and the luminescent dopant corresponds to virtually all the advantageous conditions a) to d) according to the invention:

a) $E_{M1}$ (4.3) $E_{O1C}$ (3.0) and $E_{M2}$ (4.5 to 5.0)$<E_{O2V}$ (6.6)
b) $E_{O2C}$ (2.6)$<<E_{O1C}$ (3.0), which makes it possible to ensure blocking of the electrons; on the other hand, since the inequality $E_{O1V}$ (6.3)$>>E_{O2V}$ (6.6) is not satisfied, blocking of the holes is not efficiently ensured;
c) $E_{DLV}-E_{DLC}$ (=3.0 eV)$<E_{O2V}-E_{O2C}$+0.3 eV (=4.3 eV) since the luminescent dopant dopes a zone of the second layer;
d) $E_{DLV}-E_{DLC}$ (=3.0 eV)$<E_{O2V}-E_{O1C}$+0.3 eV (=3.9 eV) and $E_{DLV}-E_{DLC}$ (=3.0 eV)$<E_{O1V}-E_{O2C}$+0.3 eV (4 eV); it can be seen here that the two conditions for limiting the exiplexes are satisfied, as in the previous two examples.

The diode obtained has electrical and luminous performances that are entirely comparable with that of Examples 1 and 2.

EXAMPLE 4

This example is intended to illustrate another embodiment with reference to FIG. 3, in which the diode comprises only a single luminescent zone which is contained in the layer based on material O1, which is in contact with the cathode.

With the aid of a method comparable to that described in Example 1, using the same doping levels and the same thicknesses, the following stack is produced: ITO/F4TCNQ-doped TCTA/TCTA/rubrene-doped Alq3/Alq3/Li-doped Alq3/Al. The organic material O1 of the first layer is Alq3 here, an abbreviated name for tris(8-hydroxy quinoline) aluminum. The organic material O2 of the second layer is TCTA here, an abbreviated name for 4,4',4'-tri(N-carbazol)triphenyl-amine. The luminescent dopant is here again rubrene. If $E_{M1}$=4.3 eV denotes the work function of aluminum, $E_{M2}$=4.5 to 5.0 eV denotes that of ITO, if $E_{O1C}$=2.9 eV denotes the energy of the LUMO level and $E_{O1V}$=5.8 eV denotes the energy of the HOMO level of Alq3, $E_{O2C}$=2.7 eV denotes the energy of the LUMO level and $E_{O2V}$=5.8 eV denotes the energy of the HOMO level of TCTA, $E_{DLC}$=3.0 eV denotes the energy of the LUMO level and $E_{DLV}$=5.3 eV denotes the energy of the HOMO level of the luminescent dopant rubrene, then it is found that the choice of the materials and the luminescent dopant corresponds to virtually all the advantageous conditions a) to d) according to the invention:

a) $E_{M1}$ (4.3)$\geq E_{O1C}$ (2.9) and $E_{M2}$ (4.5 to 5.0)$\leq E_{O2V}$ (5.8)
b) $E_{O2C}$ (2.7)<$E_{O1C}$ (2.9) and $E_{O1V}$ (6.0)>$E_{O2V}$ (5.8);
c) $E_{DLV}-E_{DLC}$ (=2.3 eV)<$E_{O1V}-E_{O1C}$+0.3 eV (=3.4 eV) since the luminescent dopant dopes a zone of the first layer;
d) $E_{DLV}-E_{DLC}$ (=2.3 eV)<$E_{O2V}-E_{O1C}$+0.3 eV (=3.2 eV) and $E_{DLV}-E_{DLC}$ (=3.0 eV)<$E_{O1V}-E_{O2C}$+0.3 eV (3.6 eV); it can be seen here that the two conditions for limiting the exiplexes are satisfied.

The diode obtained has quite exceptional electrical and luminous performances since all the conditions according to the invention are satisfied. The invention applies in particular to light-emitting diode panels, for example for illumination or for image display; it is clear to the person skilled in the art that it may be applied to any system incorporating a plurality of light-emitting organic diodes, without departing from the scope of the appended claims.

The invention claimed is:

1. An organic light-emitting diode, comprising:
a cathode and an anode, and, interposed between said cathode and said anode,
a first layer in contact with said cathode, based on a first organic material which is n-doped in a zone of this layer that is in contact with this cathode,
a second layer in contact with said anode, based on a second organic material which is p-doped in a zone of this layer that is in contact with this anode, wherein:
said first layer comprises an electroluminescent zone which is in contact with the second layer and which is not n-doped;
said second layer comprises an electroluminescent zone which is in contact with the first layer and which is not p-doped;
said second organic material is different to said first organic material;
wherein if the cathode and the anode are made of conductive material (M1) and (M2) respectively, and if the work functions of the material (M1) and of the material (M2) are respectively denoted $E_{M1}$ and $E_{M2}$, if $E_{O1C}$ denotes the electron affinity or energy of the LUMO level and $E_{O1V}$ denotes the ionization potential or energy of the HOMO level of the first organic material, and $E_{O2C}$ denotes the energy of the LUMO level and $E_{O2V}$ denotes the energy of the HOMO level of the second organic material, all these levels being evaluated positively relative to the energy of an electron in a vacuum at infinity, then the conductive material of the cathode, that of the anode, and the first and second organic materials are selected such that: $E_{M1} \geq E_{O1C}$, $E_{M2} \leq E_{O2V}$, $E_{O2C}$ <$E_{O1C}$ and $E_{O1V} > E_{O2V}$ and wherein both electroluminescent zones (4;4') comprises at least one luminescent dopant which is selected so that its LUMO level defined by $E_{DLC}$ and its HOMO level defined by $E_{DLV}$ are such that $E_{DLC} > E_{O1C}$, $E_{DLV} < E_{O2V}$ and $E_{DLV} - E_{DLC} < E_{O2V} - E_{O1C}$ +0.3 eV, thereby preventing the formation of exciplex in the organic light-emitting diode.

2. The diode as claimed in claim 1, wherein the thickness of the n-doped zone of the first layer and that of the p-doped zone of the second layer are more than 20 nm.

3. The diode as claimed in claim 1, wherein it also comprises at least one diffusion barrier zone which is not substantially doped, and which is interposed between one of said doped zones and one of said electroluminescent zones.

4. The diode as claimed in claim 3, wherein the thickness of each diffusion barrier zone is less than 20 nm.

5. Image-display or illumination panel, wherein it comprises a plurality of diodes as claimed in claim 1.

6. Image-display or illumination panel, wherein it comprises a plurality of diodes as claimed in claim 2.

7. The diode as claimed in claim 1, wherein the first organic material is selected from the group consisting of Bphen, BCP, DPVBi, TPBi and Alq3, and wherein the second organic material is selected from the group consisting of Spiro-TAD, TAZ and TCTA.

* * * * *